(12) United States Patent
Sicard et al.

(10) Patent No.: US 12,154,930 B2
(45) Date of Patent: Nov. 26, 2024

(54) THREE-DIMENSIONAL MICROELECTRONIC CIRCUIT WITH OPTIMISED DISTRIBUTION OF ITS DIGITAL AND ANALOGUE FUNCTIONS

(71) Applicant: COMMISSARIAT A L'ENERGIE ATOMIQUE ET AUX ENERGIES ALTERNATIVES, Paris (FR)

(72) Inventors: Gilles Sicard, Grenoble (FR); Perrine Batude, Grenoble (FR); Didier Lattard, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 512 days.

(21) Appl. No.: 17/476,996

(22) Filed: Sep. 16, 2021

(65) Prior Publication Data
US 2022/0093671 A1 Mar. 24, 2022

(30) Foreign Application Priority Data
Sep. 18, 2020 (FR) ...................................... 2009492

(51) Int. Cl.
*H01L 27/146* (2006.01)

(52) U.S. Cl.
CPC .. *H01L 27/14636* (2013.01); *H01L 27/14634* (2013.01)

(58) Field of Classification Search
CPC .................... H01L 27/14636; H01L 27/14634
See application file for complete search history.

(56) References Cited

U.S. PATENT DOCUMENTS

| | | |
|---|---|---|
| 2009/0242950 A1 | 10/2009 | McCarten et al. |
| 2010/0276572 A1 | 11/2010 | Iwabuchi et al. |
| 2015/0163425 A1 | 6/2015 | Oganesian et al. |
| 2017/0338268 A1 | 11/2017 | Mitsuhashi et al. |

(Continued)

FOREIGN PATENT DOCUMENTS

TW 2018-42660 12/2018

OTHER PUBLICATIONS

Takahashi et al, "A 4.1Mpix 280fps Stacked CMOS Image Sensor with Array-Parallel ADC Architecture for Region Control", IEEE Symposium on VLSI Circuits Digest of Technical Papers (VLSI 2017), Jun. 2017, 2 pages.

(Continued)

*Primary Examiner* — Tony Ko
(74) *Attorney, Agent, or Firm* — Oblon, McClelland, Maier & Neustadt, L.L.P.

(57) ABSTRACT

A microelectronic circuit comprising:
a stack of lower, intermediate and upper circuit tiers,
a matrix of devices outputting and/or receiving analogue electrical signals, made in the upper circuit tier,
an analogue amplification and/or processing circuit made in the lower circuit tier,
a digital processing circuit made in the intermediate circuit tier,
an analogue-to-digital and/or digital-to-analogue conversion circuit made in the lower and/or intermediate circuit tier, electrically coupled to the analogue circuit and the digital circuit,
electrical interconnections passing through the intermediate circuit tier and coupling the analogue circuit to the devices.

16 Claims, 3 Drawing Sheets

(56) References Cited

U.S. PATENT DOCUMENTS

2018/0227549 A1\* 8/2018 Cai .................. H01L 27/14634
2021/0104571 A1 4/2021 Shohji et al.

OTHER PUBLICATIONS

Millet et al, "A 5500fps 85GOPS/W 3D stacked BSI Vision Chip Based on Parallel In-Focal-Plane Acquisition and Processing", IEEE Symposium on VLSI Circuits Digest of Technical Papers, Jun. 2018, 2 pages.

Millet et al, "A 5 Million Frames Per Second 3D Stacked Image Sensor With In-Pixel Digital Storage", IEEE, 2018, 4 pages.

Haruta et al, "A 1/2.3inch 20Mpixel 3-layer stacked CMOS Image Sensor with DRAM", IEEE International Solid-State Circuits Conference, ISSCC 2017 Session 4 Imagers 4.6, Feb. 6, 2017, 3 pages.

\* cited by examiner

THREE-DIMENSIONAL MICROELECTRONIC CIRCUIT WITH OPTIMISED DISTRIBUTION OF ITS DIGITAL AND ANALOGUE FUNCTIONS

TECHNICAL FIELD

The invention relates to the field of design and manufacture of microelectronic circuits with a three-dimensional or 3D structure, that is formed by several circuit levels, or tiers, which each correspond to a planar or 2D microelectronic circuit and which are stacked on each other and electrically connected to each other in a located manner, that is by means of electrical interconnections made within the microelectronic circuits.

The invention advantageously applies to making matrix sensors or imagers, but also to any type of microelectronic circuit including a matrix of devices and integrating analogue and digital electronic functions.

STATE OF PRIOR ART

In a matrix sensor, for example an image sensor, made in the form of a 2D microelectronic circuit, all the electronic functions of the sensor are monolithically integrated with a matrix of detectors of the sensor in a same semiconductor layer. From a sensor performance point of view, it is generally desired to reduce the dimension (pitch) of the photosensitive pixels, improve its acquisition speed, its sensitivity and its input dynamic range, and reduce its power consumption.

Making microelectronic circuits with a 3D structure has several advantages. Thus, the proximity between the different superimposed 2D circuits forming the 3D circuit makes it possible to obtain a significant gain in performance, due in particular to the reduction in the lengths of the electrical interconnections between the different functions of the circuit or the possibility of implementing the electronic functions in a more paralleled manner. Another advantage brought about by the 3D structure is the possibility of distributing the functions (digital, analogue, detection) of the 3D circuit on different tiers according to their specificities. Thus, it is possible to choose, for making the components implementing each function, the most adequate technology and optimise the performance of each 2D circuit dedicated to each function independently of the others.

A first technique for making 3D microelectronic circuits consists in making different parts of the 3D circuit in parallel in the form of several 2D circuits from different wafers, and then superimposing and interconnecting these 2D circuits by electrical interconnections of the TSV (Through Silicon Via) type or by microbeads or metal pads. Such technology is called 3D parallel integration or 3D stacking or 3D packaging.

Document [1] by T. Takahashi et al, "A 4.1 Mpix 280 fps Stacked CMOS Image Sensor with Array-Parallel ADC Architecture for Region Control", IEEE Symposium on VLSI Circuits (VLSI 2017), Kyoto, Japan, Jun. 5-8, 2017, provides an imager comprising two semiconductor layers, or two tiers, with matrix-like electrical interconnections between these two tiers and in which several analogue-to-digital converters (ADCs) each address a group of pixels. Compared to a 2D image sensor, the acquisition speed is greatly improved while maintaining reasonable power consumption. This sensor is made by 3D parallel integration.

Document [2] US 2017/0338268 A1 also describes a 3D imager comprising a two-tier stack made by 3D parallel integration, with making the photodetection elements in a first semiconductor layer and making a digital circuit in a second semiconductor layer.

Document [3] by L. Millet et al, "A 5500 fps 85 GOPS/W 3D stacked BSI vision chip based on parallel in-focal-plane acquisition and processing", IEEE Symposium on VLSI Circuits, Hawaii, USA, 18-22 Jun. 2018, provides making an imager by 3D parallel integration, comprising a dense matrix connection that makes it possible, by means of a layer in which a digital computational circuit is made, to achieve very good image acquisition and processing performance. The digital computational circuit is made with the same technology as the detection matrix of the imager.

FIG. 1 schematically shows the path of data acquired within an image sensor 10 including two layers, as in the previously mentioned documents [1] to [3], and made by 3D parallel integration.

A signal, for example a light signal, is first acquired by a matrix of detectors 12 of the sensor 10. These detectors 12 correspond to photosensitive elements, for example photodiodes (PN junctions), phototransistors or even photodiodes associated with transfer gates. The matrix of detectors 12 outputs analogue signals 14 which are input to an analogue circuit 16 for amplifying and shaping these analogue signals 14. Signals 18 (which are analogue) outputted by the analogue circuit 16 are input to analogue-to-digital converters 20 which convert the signals 18 into digital signals 22. The digital signals 22 are then sent as an input to a digital processing circuit 24 for signals 22. Although not shown, the sensor 10 generally includes other elements such as a line decoder coupled to the matrix of detectors 12, a multiplexer the inputs of which are coupled to the outputs of the analogue-to-digital converters 20 and the output of which is coupled to the input of the digital processing circuit 24, as well as a digital control circuit controlling or driving the matrix of detectors 12.

In such a sensor 10, the matrix of detectors 12, the analogue circuit 16 and the analogue-to-digital converters 20 are made in an upper semiconductor layer of the sensor 10, and the digital processing circuit 24 is made in a lower semiconductor layer of the sensor 10. The dotted line with reference 26 symbolically represents the boundary between the upper layer and lower layer. In such a configuration, these elements of the sensor 10 (matrix of detectors 12, analogue circuit 16, analogue-to-digital converters 20, digital circuit 24) may be similar to those of a 2D sensor. Only the metallisation layers forming the interconnections between both layers are specific to such a sensor 10. This is advantageous as existing 2D circuit designs, or architectures, can be reused for making the sensor elements 10.

Alternatively, it is possible that the electronic components forming the analogue-to-digital converters 20 are distributed on both semiconductor layers of the sensor 10. Indeed, these converters 20 include analogue components and digital components. In this case, the analogue components are made in the same layer as that in which the components of the analogue circuit 16 are made, and the digital components are made in the same layer as that in which the components of the digital circuit 24 are made. FIG. 2 schematically shows such a distribution. The advantage of this alternative is that both types of components of the sensor 10 can be made on a same layer with a dedicated technology adapted to making the type of these components, which makes it possible to obtain good performance for all the components of the sensor 10. However, in this alternative, it is not possible to use existing 2D circuit designs. Such a configuration is, for example, described in Document [4] by L. Millet et al. "A 5 Million Frames Per Second 3D Stacked Image Sensor With In-Pixel Digital Storage", IEEE ESSCIRC International Conference, Dresden, Germany, 3-6 Sep. 2018.

Document [5] by T. Haruta et al, "A 1/2.3 inch 20 Mpixel 3-layer stacked CMOS Image Sensor with DRAM", IEEE International Solid-State Circuits Conference (ISSCC 2017), San Francisco, USA, 5-9 Feb. 2017, describes an imager made in 3D technology. The sensor is made on three tiers, or three layers: a first tier in which a digital processing circuit is made, a second tier in which a RAM memory circuit is made and a third tier in which a matrix of detectors and the analogue components of the imager are made. The three tiers are made independently of each other and are then assembled and electrically interconnected to each other by TSV-type interconnections made on one side of the sensor.

Making this image sensor by 3D parallel integration is advantageous because the detection, digital processing and analogue processing functions are distributed in three distinct superimposed circuits. This arrangement has a positive impact on the overall performance of the 3D circuit and also on the cost for making such an integrated system.

However, the main drawback of the 3D parallel technology used in the circuits described above is that the electrical interconnections used to interconnect the different superimposed circuits have too large dimensions and therefore do not allow a high density of interconnections between the superimposed layers. For this reason, in the sensor described in [5], the interconnections are located on one side of the sensor. Such interconnections cannot be used for highly parallel digital image processing architectures. This limits the possible architectures to conventional ones, making it possible to improve processing performance only through a technological change.

A second technique for making 3D microelectronic circuits called 3D sequential, or 3D monolithic, integration differs from 3D parallel integration in that it allows a stack of both 2D circuits to be created by building these circuits directly on top of each other. For example, after manufacturing the first circuit especially including a transistor tier and metal interconnection lines, a second substrate is transferred to the first circuit, for example by oxide-oxide bonding. The second substrate is then thinned, and the transistors of the second circuit are then manufactured. The electrical interconnections between both circuits, forming 3D contacts also known as MIVs (monolithic inter-tier vias), are then made to create the interconnections between both circuits. Finally, the metal interconnection layers of the second circuit are made.

Compared to 3D parallel integration, 3D sequential integration allows for smaller interconnections (for example, with a cross-section in the order of 100 nm) because the thickness of the material through which the MIV-type contacts pass is much smaller than that through which the interconnections made by 3D parallel integration pass. A high density of electrical interconnections between the superimposed circuits can therefore be achieved.

However, in such a 3D sequential integration, transistors of the second circuit have to be manufactured at a lower temperature than normal temperature (typically less than 400° C. or in some cases less than 500° C.) in order not to degrade performance of the transistors of the first circuit.

Document [6] US 2015/0163425 A1 provides making an image sensor using 3D sequential technology to form three electronic tiers. In this sensor, photodetectors are made in an upper semiconductor layer, a digital processing circuit is made in a lower semiconductor layer, and analogue-to-digital converters are made in an intermediate semiconductor layer disposed between the lower and upper layers. FIG. 3 schematically shows the path of data in the elements of such a sensor. In such a configuration, an upper semiconductor layer is dedicated to the matrix of detectors 12, a lower semiconductor layer is dedicated to the digital functions (digital processing circuit 24) and an intermediate semiconductor layer, disposed between the lower and upper layers, is dedicated to the analogue functions (analogue circuit 16 and analogue-to-digital converters 20). The dotted lines 28 and 30 symbolically represent the boundaries between these three layers. In such a sensor, the digital circuit can be made such that its components have good performance since it is made from the first substrate on which the other elements will be made. On the other hand, the analogue components made in the intermediate layer will not have the desired performance because of the limitation of the temperatures that may be involved when making these analogue components, since the steps implemented to make the analogue components in the intermediate layer should not degrade the components of the digital circuit previously made in the lower layer.

The above mentioned problems for an imaging device are also found in the case of a display-type device having a 3D structure, and more generally in all microelectronic circuits having a 3D structure and comprising a matrix of devices disposed within an upper circuit tier.

DISCLOSURE OF THE INVENTION

Thus there is a need to provide a microelectronic circuit the 3D architecture of which allows the distribution of digital and analogue components in a stack of at least three semiconductor layers to be optimised, and in which making the analogue components does not impact the performance of the digital components and vice versa.

For this, one embodiment provides a microelectronic circuit comprising at least:
- a stack of at least a lower circuit tier, an intermediate circuit tier and an upper circuit tier, which are distinct from each other and such that the intermediate circuit tier is disposed between the lower circuit tier and the upper circuit tier,
- a matrix of devices in the upper circuit tier configured to output and/or receive as an input analogue electrical signals,
- an analogue amplification and/or processing circuit made in the lower circuit tier,
- a digital processing circuit made in the intermediate circuit tier,
- an analogue-to-digital and/or digital-to-analogue conversion circuit formed by microelectronic components made in the lower circuit tier and/or in the intermediate circuit tier, and comprising inputs and outputs electrically coupled to inputs and/or outputs of the analogue amplification and/or processing circuit and to inputs and/or outputs of the digital processing circuit,
- electrical interconnections passing through the intermediate circuit tier and electrically coupling inputs and/or outputs of the analogue amplification and/or processing circuit to inputs and/or outputs of the devices.

This microelectronic circuit includes a judicious positioning of the analogue and digital components in its stack, which makes it possible to guarantee the achievement of good performance for these components, while minimising costs related to making the microelectronic circuit. Indeed, the components of the analogue circuit are made in the lower circuit tier, which includes the initial substrate used when making the microelectronic circuit, and the components of the digital circuit are made in the intermediate circuit tier. In this configuration, the analogue components can be made without any restriction on the temperatures involved in making them, which makes it possible to achieve good performance for these analogue components, particularly for the analogue transistors made: high intrinsic gain, low noise, low on-state resistance. In addition, the performance of digital components, especially transistors, is not limited by the dimensions of the electrical interconnections connecting these components to the other elements of the circuit. Finally, the devices made in the upper circuit tier can also be made with optimised performance.

The structure of this circuit is not intuitive because, unlike sensors of prior art, analogue processing of data from the devices in the matrix formed in the upper circuit tier is not performed in a circuit tier adjacent to the one including the matrix of devices.

In this structure, the functions are grouped by tier: analogue functions in the lower circuit tier, digital functions in the intermediate circuit tier, and detection and/or transmission functions in the upper circuit tier. Such a distribution is advantageous in terms of design cost of the microelectronic circuit.

It is possible that the matrix of devices includes both detector-type devices, for example photosensitive components such as photodiodes or NEMS-type components, and transmitter-type devices, for example LEDs.

In this microelectronic circuit, analogue transistors differ from digital transistors in that they are often made with larger dimensions, both in terms of gate length and gate width and in terms of the thickness of the oxide under the gate. For example, the gate length of analogue transistors made in the lower circuit tier (for example equal to 90 nm) may be three to five times larger than that of digital transistors in the intermediate circuit tier (for example equal to 28 nm).

The intermediate circuit tier may have a thickness of less than about 500 nm, and the electrical interconnections may each have a cross-section with a dimension of less than about 200 nm.

The electric connection between the upper and lower circuit tiers is through the intermediate circuit tier. However, as this intermediate circuit tier is very thin, the losses at the interconnections forming this electric connection, which are related to the resistivity and stray capacitances of the conductor used, remain minimal.

The dimension of a cross-section of one of the electrical interconnections passing through the intermediate circuit tier corresponds to the largest dimension of that interconnection in a plane substantially parallel to the main faces of the intermediate tier and which face the lower and upper circuit tiers. For example, in the case of such an electrical interconnection having a disc-shaped cross-section, this dimension corresponds to the diagonal of the disc. In the case of such an electrical interconnection having a polygonal shaped cross-section, this dimension corresponds to the largest diagonal of that polygon.

Advantageously, the analogue-to-digital and/or digital-to-analogue conversion circuit may include analogue microelectronic components made in the lower circuit tier and digital microelectronic components made in the intermediate circuit tier. Thus, all microelectronic components of the analogue-to-digital and/or digital-to-analogue conversion circuit can be made with an optimised technology corresponding to the one implemented when making the analogue amplification and/or processing circuit for the analogue components and the one implemented when making the digital processing circuit for the digital components.

The number of electrical interconnections passing through the intermediate circuit tier and electrically coupling inputs and/or outputs of the analogue amplification and/or processing circuit to inputs and/or outputs of the devices may be at least equal to the number of devices such that each device is directly coupled to one of these electrical interconnections. Thus, each device may be directly connected to the analogue circuit by means of one of these electrical interconnections.

Alternatively, it is possible for each of these electrical interconnections to be coupled to several devices forming, for example, a sub-matrix within the matrix formed by all the devices. It is also possible for each of these electrical interconnections to be coupled to one of the columns or one of the rows of the matrix of devices. In this case, the circuit includes more devices than electrical interconnections.

The devices may include photodetectors. The microelectronic circuit may correspond in this case to an imager or image sensor.

According to a first configuration:
the upper circuit tier may include two opposite main faces,
the photodetectors may be electrically coupled to at least one interconnecting metallisation tier disposed on the side of a first of both main faces of the upper circuit tier and facing the intermediate circuit tier, and may include photosensitive surfaces disposed on the side of a second of both main faces of the upper circuit tier, or the photodetectors may include at least one organic or colloidal photodetection layer and an electrically conductive layer forming electrodes of the photodetectors such that the electrically conductive layer is disposed between the photodetection layer and the intermediate circuit tier (in this case the electrically conductive layer is disposed on the side of the first main face of the upper circuit tier).

In this first configuration, the microelectronic circuit forms a backside illumination imager, or BSI sensor. The second main face of the upper circuit tier corresponds in this case to the surface receiving photons to be detected.

According to a second configuration:
the upper circuit tier may include two opposite main faces,
the photodetectors may be electrically coupled to at least one interconnection metallisation tier disposed on the side of a first of both main faces of the upper circuit tier, and may include photosensitive surfaces disposed on the side of the first of both main faces of the upper circuit tier or the photodetectors may include at least one organic or colloidal photodetection layer and an electrically conductive layer forming electrodes of the photodetectors such that the organic or colloidal photodetection layer is disposed between the electrically conductive layer and the intermediate circuit tier.

In this second configuration, the microelectronic circuit forms a frontside illumination imager, or FSI sensor. In this case the first main face of the upper circuit tier corresponds to the surface receiving photons to be detected. The second main face of the upper circuit tier can face the intermediate circuit tier.

In this second configuration, when the upper circuit tier is made by 3D parallel integration, the upper circuit tier may have a thickness of between about 3 µm and 10 µm, and electrical interconnections passing through the upper semiconductor layer may have cross-sections with dimensions of less than about 500 nm. Alternatively, when the upper circuit tier is made by 3D sequential integration, the upper circuit tier may have a thickness of less than about 500 nm, and electrical interconnections passing through the upper semiconductor layer may have cross-sections with dimensions of less than about 200 nm.

In the above paragraph, the dimension of a cross-section of one of the electrical interconnections passing through the upper semiconductor layer corresponds to the largest dimension of that interconnection in a plane substantially parallel to the main faces of the upper layer and one of which faces the intermediate semiconductor layer.

According to other configurations, the semiconductor devices in the upper layer may include light emitting diodes or MEMS or NEMS devices or THz antennas (that is, capable of transmitting and/or receiving waves with wavelengths having values between 0.1 and 10 THz). As an example, the matrix of semiconductor devices may correspond to a matrix of NEMS devices for making molecular mass measurements.

The microelectronic circuit may include several distinct intermediate circuit tiers, disposed between the lower and upper circuit tiers, and including digital circuits such as memory circuits and/or data processing circuits, wherein each intermediate circuit tier may have a thickness of less than about 500 nm, and electrical interconnections electrically coupling inputs and/or outputs of the analogue amplification and/or processing circuit to inputs and/or outputs of the devices may pass through each of the intermediate circuit tiers. These digital circuits can be made by 3D sequential integration.

Another embodiment relates to a method for making a microelectronic circuit, including at least the steps of:
  making, in a lower circuit tier including a first substrate, at least one analogue amplification and/or processing circuit, and then
  making at least one intermediate circuit tier on the lower circuit tier, and then
  making at least one digital processing circuit in the intermediate circuit tier,
  making at least one matrix of devices, configured to output and/or receive as an input analogue electrical signals, in an upper circuit tier, the intermediate circuit tier being disposed between the upper circuit tier and the lower circuit tier,
and further including the steps of:
  making at least one analogue-to-digital and/or digital-to-analogue conversion circuit formed by microelectronic components made in the lower circuit tier during steps common to making of the analogue amplification and/or processing circuit and/or in the intermediate circuit tier during steps common to making of the digital processing circuit, and comprising inputs and outputs electrically coupled to inputs and/or outputs of the analogue amplification and/or processing circuit as well as to inputs and/or outputs of the digital processing circuit,
  making electrical interconnections passing through the intermediate circuit tier, electrically coupling inputs and/or outputs of the analogue amplification and/or processing circuit to inputs and/or outputs of the devices.

The digital processing circuit may be made in the intermediate circuit tier with a thermal budget of less than about 500° C. For example, the digital processing circuit can be made in the intermediate circuit tier with a thermal budget of less than 400° C. when the lower circuit tier does not include copper interconnections or silicide portions, or less than about 500° C. otherwise. Such a thermal budget prevents damage to the analogue components present in the lower circuit tier on which the digital processing circuit is made.

Making the intermediate circuit tier may include:
  bonding a second semiconductor substrate to the lower circuit tier, and then thinning the second semiconductor substrate, or
  transferring a semiconductor layer to the lower circuit tier implemented using a first temporary substrate to which the semiconductor layer is secured, or
  depositing the semiconductor layer onto the lower circuit tier.

The term "semiconductor layer" refers to any layer of material having semiconducting properties, and can, for example, correspond to a layer including at least one amorphous or polycrystalline semiconductor (for example of silicon), or carbon nanotubes (or CNT), or at least one semiconductor oxide, or at least one transition metal dichalcogenide (or TMD).

Making the upper circuit tier may include:
  bonding a third substrate to the intermediate circuit tier, and then thinning the third substrate, or
  transferring a layer of material for making the matrix of devices to the intermediate circuit tier, implemented using a second temporary substrate to which said layer of material is secured, or
  depositing the layer of material used for making the matrix of devices onto the intermediate circuit tier, or
  transferring the upper circuit tier on the intermediate circuit tier.

The layer of material used for making the matrix of devices may correspond to a semiconductor layer or an organic or colloidal photodetection material layer.

In the case of sequential integration of the upper circuit tier, that is when the matrix of devices is made after the third substrate has been bonded and thinned or after the layer of material used for making the matrix of devices has been deposited or transferred, this matrix is made in the upper circuit tier with a thermal budget adapted not to damage the components in the lower and intermediate circuit tiers, for example with temperatures of less than about 400° C. or 500° C.

In the case of parallel integration of the upper circuit tier, that is when it is made independently of the other elements of the microelectronic circuit, and then transferred to the intermediate circuit tier, the electrical interconnections of the matrix of devices may be made by means of contact pads present at the interface of the upper and intermediate circuit tiers, or by means of TSV-type interconnections made through the upper circuit tier.

Advantageously, the invention can be applied to an image sensor and a method for making the same. However, the invention can be applied to any circuit, in particular of the detector and/or transmitter-type, comprising sensors and/or transmitters disposed in the form of matrix(es) compatible with production techniques in the microelectronics field.

BRIEF DESCRIPTION OF THE DRAWINGS

The present invention will be better understood upon reading the description of exemplary embodiments given purely by way of indicating and in no way limiting purposes with reference to the appended drawings in which.

Identical, similar or equivalent parts of the different figures described hereinafter bear the same numerical references so as to facilitate switching from one figure to another.

The different parts shown in the figures are not necessarily to a uniform scale, in order to make the figures more legible.

The different possibilities (alternatives and embodiments) should be understood as not being exclusive of each other and may be combined with each other.

DETAILED DISCLOSURE OF PARTICULAR EMBODIMENTS

Figure 1:
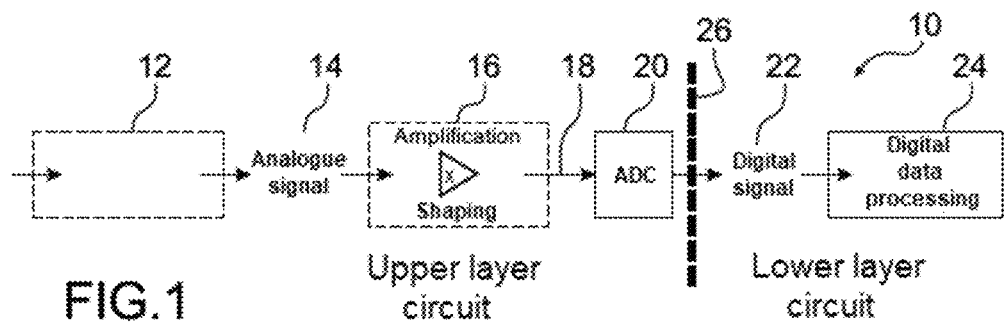
FIGS. 1 to 3 show the paths of the data acquired in different three-dimensional sensors of prior art.
Figure 2:
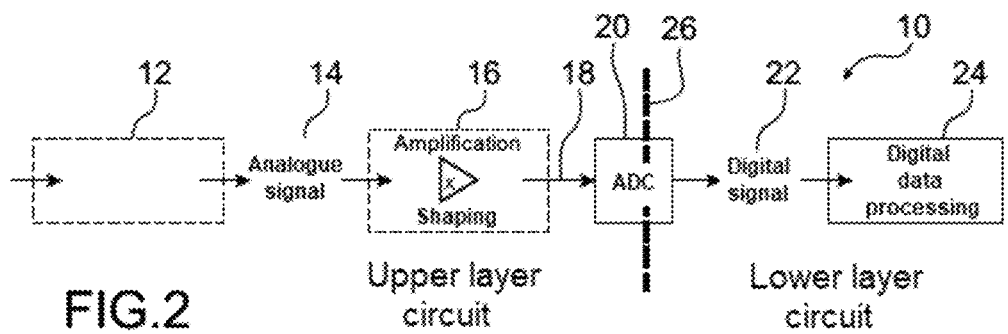
Figure 3:
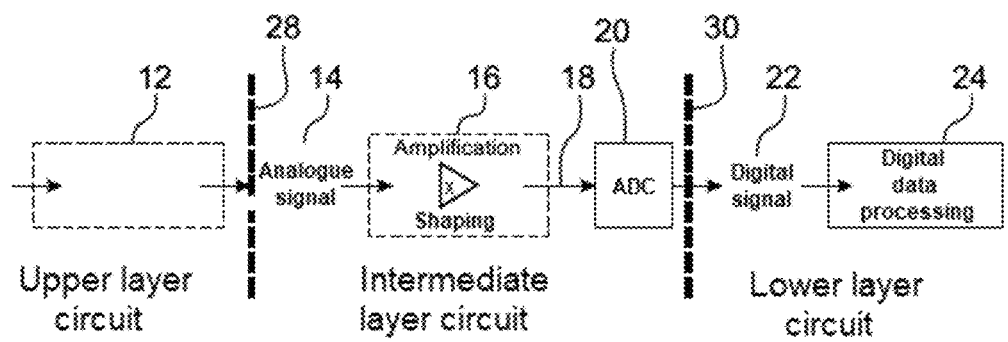
Figure 4:
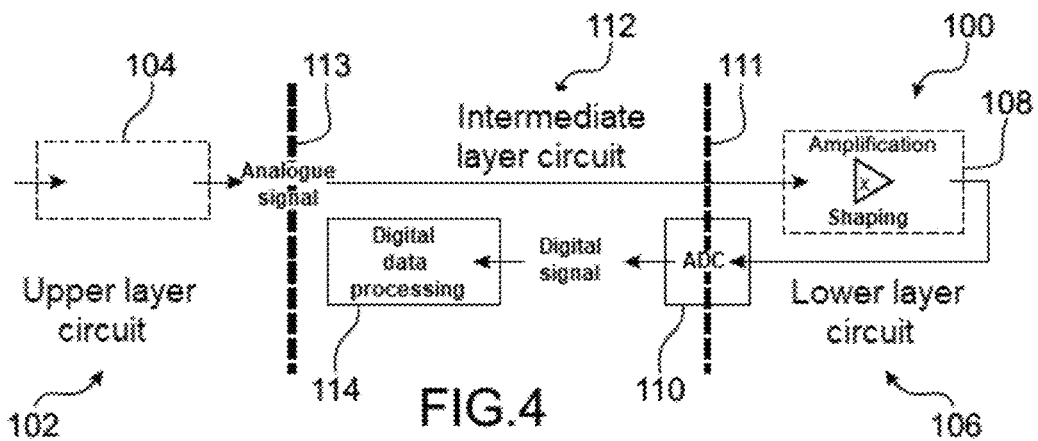
FIG. 4 schematically shows the path of data acquired in a microelectronic circuit according to a first embodiment.

FIG. 4 schematically shows the path of data acquired in a three-dimensional microelectronic circuit 100 according to a first embodiment. In this first embodiment, the circuit 100 corresponds to an image sensor, and the path of data shown in FIG. 4 corresponds to the route travelled by the acquired data, which correspond to the captured images, in the different elements of the sensor. FIGS. 5 to 9 schematically show five exemplary embodiments of such a circuit 100 according to the first embodiment.

The circuit 100 includes an upper circuit tier 102 in which a matrix of devices 104 configured to output and/or receive as an input analogue electrical signals corresponding to the data signals transmitted and/or received by the devices 104 is made. In the first embodiment described here, the devices 104 include photodetectors, for example photodiodes each associated with at least one transfer gate and/or at least one transistor, or phototransistors or photodiodes formed in an organic or colloidal material layer.

Figure 5:
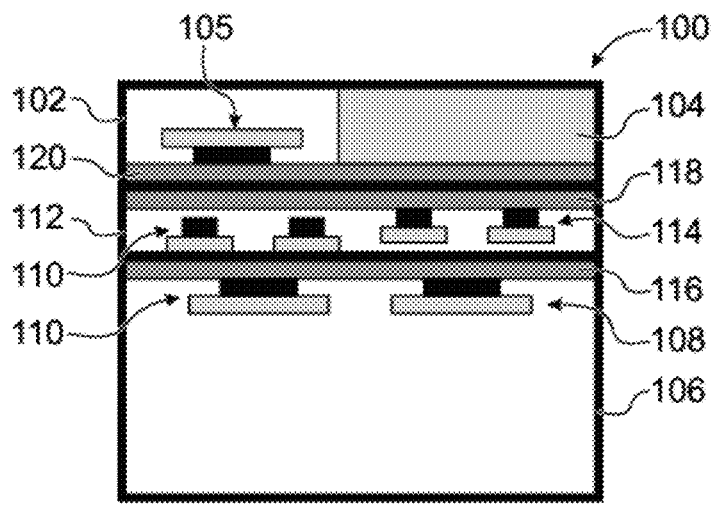
FIGS. 5 to 9 schematically show exemplary embodiments of a microelectronic circuit according to the first embodiment.
Figure 6:
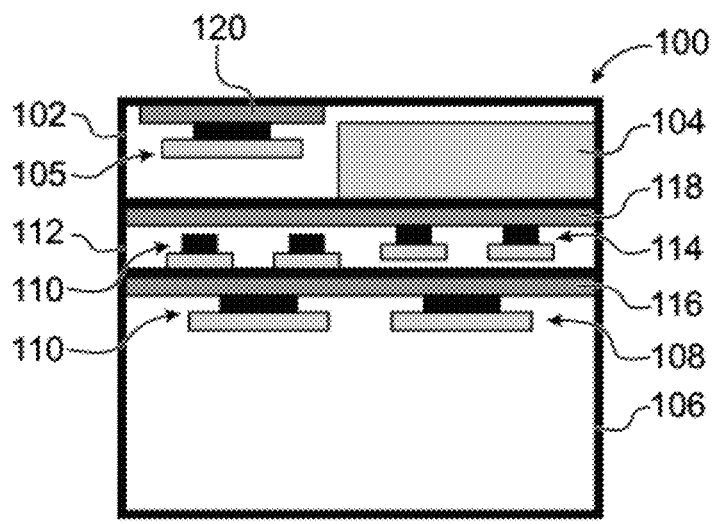
Figure 7:
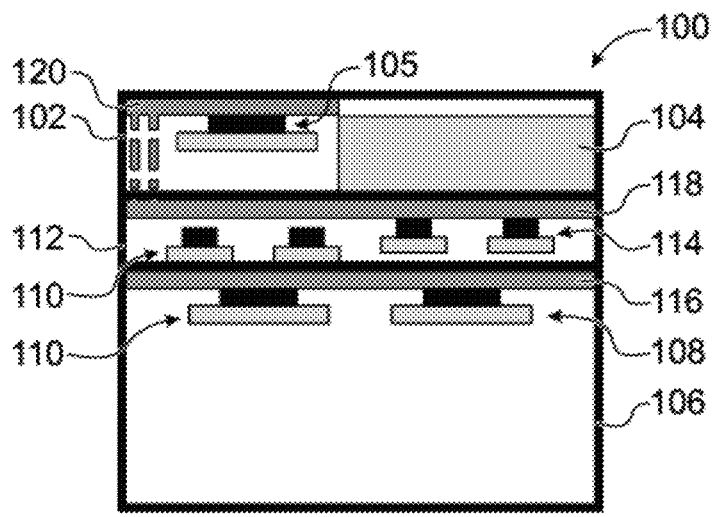

In each of FIGS. 5 to 7, a device 104 corresponding to a photodiode is shown, associated with an analogue circuit 105 which may include transistors and/or capacitors and/or a transfer gate. The upper circuit tier 102 may include a semiconductor layer from which the devices 104 and the analogue circuits 105 are made, as is the case, for example, in the exemplary embodiments of FIGS. 5 to 7.

Figure 8:
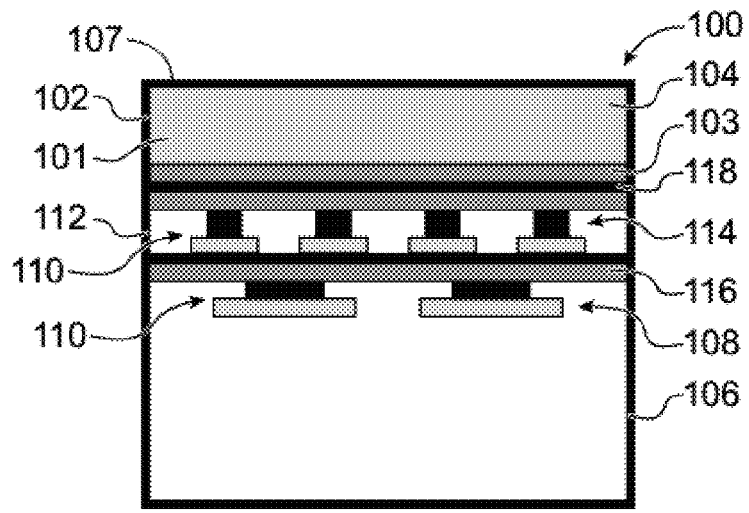
Figure 9:
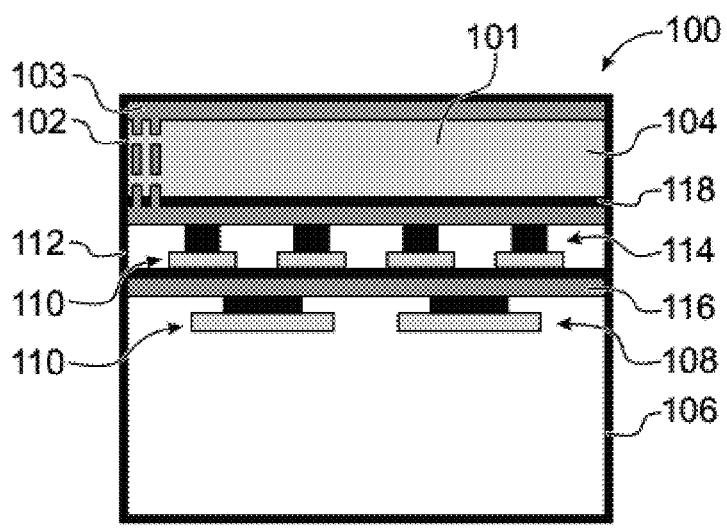

In FIGS. 8 and 9, the upper circuit tier 102 includes devices 104 corresponding to photodiodes formed by an organic or colloidal photodetection layer 101 and an electrically conductive layer 103 forming electrodes of these photodiodes.

Alternatively, the photodetectors may correspond to photodetection elements outputting electrical charges, such as for example CCD (charge-coupled device)-type photodetection elements, or outputting voltages, such as for example CMOS-type photodetection elements.

The circuit 100 also includes a lower circuit tier 106 in which the microelectronic components used for implementing the analogue functions of the circuit 100 are made, and in particular an analogue amplification and/or processing circuit 108. In the first embodiment described here, the analogue circuit 108 performs amplification and shaping of the analogue electrical signals outputted by the matrix of photodetectors 104. The function(s) implemented by the analogue circuit 108 correspond for example to one or more of the following functions: offset compensation, sampling/blocking, noise reduction, amplification, power supply management. As an example, the analogue circuit 108 may implement a compensation function as described in S. K. Mendis et al, "CMOS active pixel image sensors for highly integrated imaging systems", IEEE JSSC, vol. 32, February 1997. In FIGS. 5 to 9, an analogue MOS transistor is shown in the lower layer 106 to symbolise the analogue circuit 108.

The circuit 100 also includes an analogue-to-digital and/or digital-to-analogue conversion circuit 110. In the first embodiment described here, the conversion circuit 110 corresponds to several analogue-to-digital converters (ADCs) operating in parallel and for converting the analogue signals output from the analogue circuit 108 into digital signals. The inputs of the conversion circuit 110 are electrically coupled to the outputs of the analogue circuit 108. The analogue-to-digital converters are, for example, ramp converters and/or any other type of converter. The conversion circuit 110 may output one or more digital signals in binary code.

Advantageously, the conversion circuit 110 has its analogue microelectronic components made in the lower circuit tier 106. In FIGS. 5 to 9, an analogue MOS transistor is shown in the lower circuit tier 106 to symbolise the analogue part of the conversion circuit 110.

The circuit 100 also includes an intermediate circuit tier 112 disposed between the upper circuit tier 102 and the lower circuit tier 106. The three circuit tiers 102, 106 and 112 are distinct from each other and are disposed on top of each other forming a stack such that the intermediate circuit tier 112 is disposed between the lower circuit tier 106 and the upper circuit tier 102. In FIG. 4, dotted lines with the references 111 and 113 symbolically delimit these circuit tiers.

The microelectronic components used for implementing the digital functions of the circuit 100 are made in the intermediate circuit tier 112. A part of these microelectronic components form a digital circuit 114 for processing the digital signals outputted by the conversion circuit 110. For example, the digital circuit 114 may enable functions for storing and/or detecting elements (objects, faces, motions, etc.) in images captured by the circuit 100. The function(s) implemented by the digital circuit 114 correspond for example to one or more of the following functions: memorisation, tone rendering, colour calculation, compression, or even image processing functions to further improve by filtering the quality of the image, to modify it or to extract useful information therefrom by detection (contours, motion, speed, . . . ) or to perform a pattern, object, face, recognition etc. Other microelectronic components made in the intermediate circuit tier 112 are used for forming a digital control or drive circuit of the circuit 100. In particular, this digital control circuit sends digital control signals to the devices 104, and can also be used for driving the conversion circuit 110. The circuit 100 includes electrical interconnections between the upper circuit tier 102 and the intermediate circuit tier 112, different from those used for transmitting data acquired by the devices 104 and transmitted to the analogue circuit 108, used for transmitting these digital control signals. This digital control circuit and the signals sent by this digital control circuit to the other elements of the circuit 100 are not shown in FIG. 4.

The outputs of the conversion circuit 110 are electrically coupled to the inputs of the digital circuit 114. In FIGS. 5 to 9, digital MOS transistors are shown in the intermediate circuit tier 112 to symbolise the digital circuit 114. In addition, the conversion circuit 110 has its digital microelectronic components made in the intermediate circuit tier 112. In FIGS. 5 to 9, a digital MOS transistor is shown in the intermediate circuit tier 112 to symbolise the digital part of the conversion circuit 110.

The signals outputted by the matrix of devices 104 correspond to analogue signals input to the analogue circuit 108 by means of electrical interconnections (not shown in FIGS. 5 to 9) from the upper circuit tier 102 to the lower circuit tier 106 and passing through the intermediate circuit tier 112. The method for making the circuit 100 which is implemented (and described in detail below), and more particularly for making the intermediate circuit tier 112, allows these electrical interconnections to be made with small dimensions, and therefore with a high density, due to the small thickness of the intermediate circuit tier 112. Thus, it is possible for each device 104 in the matrix to be directly coupled to one of these electrical interconnections that is dedicated to that device 104. Alternatively, it is possible for each of these electrical interconnections to be coupled to a group of devices 104 forming, for example, a sub-matrix within the matrix formed by all the devices 104. It is also possible for each of these electrical interconnections to be coupled to one of the columns or one of the rows of the matrix of devices 104, particularly when the devices 104 correspond to photodetectors, as is the case in the examples described in connection with the first embodiment.

The analogue signals outputted from the analogue circuit 108 are sent to the inputs of the analogue-to-digital conversion circuit 110. The digital signals output from the analogue-to-digital conversion circuit 110 are input to the digital processing circuit 114.

The circuit 100 is obtained by first making in the lower circuit tier 106, which includes for example a semiconductor substrate such as silicon, the analogue components of the circuit 100, that is here the analogue circuit 108 for amplifying and shaping the signals outputted by the matrix of devices 104 as well as the components of the analogue part of the analogue-to-digital conversion circuit 110. These analogue components include in particular analogue transistors the characteristics (in particular dimensions) of which allow them to operate in an analogue environment, in particular in terms of intrinsic gain, noise, on-state resistance, etc. The characteristics of these components and techniques implemented to make them are chosen such that they are optimal due to the fact that these analogue components are made without the presence of other components limiting thermal budget of the steps that can be implemented. These steps include the implementation of lithography, etching, doping operations, etc.

One or more interconnection tiers 116, for example metal interconnection tiers or including highly doped polysilicon, are then made on these analogue components. These interconnection tiers 116 are intended in particular to ensure electrical connections between components of the analogue part of the conversion circuit 110 and components of the digital part of the conversion circuit 110 which will subsequently be made in the intermediate layer 112, as well as electrical connections between the analogue circuit 108 and the matrix of devices 104.

Alternatively, it is possible that the lower circuit tier 106 does not include the interconnection tier(s) 116. In particular, this may be the case when the components the electrical connection pads of which are present at the interface between the lower circuit tier 106 and the intermediate circuit tier 112 correspond to transistors only. In this case, the electrical connections between the analogue circuit 108 and the matrix of devices 104 may be made through the intermediate circuit tier 112 by directly connecting the analogue circuit 108 and the matrix of devices 104, without using one or more interconnection tiers.

The digital functions of the circuit 100 are then made in 3D sequential technology, forming the intermediate circuit tier 112.

According to one exemplary embodiment, a semiconductor layer is formed on the lower circuit tier 106. If interconnection tiers 116 are present on the lower circuit tier 106, these are covered with a dielectric layer comprising, for example, oxide. An oxide layer may cover one of the faces of the transferred semiconductor layer so that oxide-oxide bonding can be implemented to secure the semiconductor layer to the lower circuit tier 106. According to a first exemplary embodiment, this transferred semiconductor layer may correspond to a substrate that is thinned after being secured to the lower circuit tier 106. According to a second exemplary embodiment, this transferred semiconductor layer may correspond to a layer that has already been thinned and is transferred to the lower circuit tier 106 using a temporary substrate secured to this thinned layer and used for handling it. In this case, the temporary substrate is removed after the thinned layer has been secured to the lower circuit tier 106. According to a third exemplary embodiment, the semiconductor layer of the intermediate circuit tier 112 may be deposited onto the lower circuit tier 106. This semiconductor layer corresponds, for example, to a layer including at least one amorphous or polycrystalline semiconductor (for example of silicon), or carbon nanotubes, or at least one semiconductor oxide, or at least one transition metal dichalcogenide.

Advantageously, the intermediate circuit tier 112 has a thickness of less than about 500 nm, which allows the electrical interconnections forming the electric connections between the analogue circuit 108 and the matrix of devices 104 to be made with small dimensions, that is, each with a cross-section with a dimension (diameter or diagonal of the cross-section) of less than about 200 nm, and for example equal to about 100 nm. With such dimensions, these interconnections can be made with densities of, for example, between $1.10^6$ and $1.10^9$ interconnections/mm$^2$.

The components for forming the digital circuit 114 as well as the components of the digital part of the conversion circuit 110 are then made in the semiconductor layer of the intermediate circuit tier 112. These components include in particular CMOS transistors the characteristics (in particular dimensions) of which allow them to operate in a digital environment, in particular in terms of speed and power consumption. In particular these steps include the implementation of lithography, etching, doping, etc. These steps are implemented at temperatures compatible with the presence of the analogue components in the lower circuit tier 106, for example of less than about 400° C. or even less than about 500° C. in the absence of copper interconnections or silicide portions in the lower circuit tier 106.

One or more metal interconnection tiers 118 are then made on the components of the intermediate circuit tier 112. These metal interconnection tiers 118 are intended, in particular, to ensure electrical connections between components of the analogue part of the conversion circuit 110 and components of the digital part of this conversion circuit 110, electrical connections between the outputs of the conversion circuit 110 and the input(s) of the digital circuit 114 as well as electrical connections between the analogue circuit 108 and the matrix of devices 104.

The upper circuit tier 102 including the matrix of devices 104 is then made on the intermediate circuit tier 112.

According to a first exemplary embodiment shown in FIG. 5, the devices 104 are made in the upper layer 102 in a backside illumination configuration (BSI sensor). For this, the devices 104 as well as any microelectronic components associated with these devices 104 (corresponding to the analogue circuit 105 in the example of FIG. 5) are firstly made in a semiconductor substrate. The steps implemented correspond in particular to steps of lithography, etching, doping, etc. These steps can be implemented without any restriction to the thermal budget. One or more electrical interconnection tiers 120 are then made on the devices 104. The assembly is then transferred and secured to the intermediate circuit tier 112 such that the electrical interconnection tier(s) 120 are disposed against the electrical interconnection tier(s) 118, with the electrical connections between these tiers 118 and 120 being ensured, for example, by means of contact pads or microbeads (hybrid bonding). Alternatively, transferring and securing the upper circuit tier 102 to the intermediate circuit tier 112 can be made by implementing oxide/oxide bonding, and then by making TSV-type through contacts to make the electrical connections.

These transferring and securing steps correspond to techniques implemented in 3D parallel technology. In the example described here, where the devices 104 correspond to photodetectors, the semiconductor substrate is then thinned until the photosensitive parts of the photodetectors are capable of performing photodetection from the side at which the thinning is performed. FIG. 5 schematically shows the sensor 100 obtained according to this first exemplary embodiment.

Alternatively, the upper circuit tier 102 may be made by implementing a 3D sequential integration step. For this, it is possible to perform:
  bonding a substrate to the intermediate circuit tier 112, then thinning the substrate and making the devices 104 from the remaining layer of this substrate thinning, or
  transferring a layer of material used for making the matrix of devices 104 onto the intermediate circuit tier 112 implemented using a temporary substrate to which said layer of material is secured, and then making the devices 104, or
  depositing the layer of material used for making the matrix of devices 104 directly onto the intermediate circuit tier 112.

According to a second exemplary embodiment, the devices 104 are made in the upper layer 102 in a frontside illumination configuration (FSI sensor). For this, a layer of material intended to be used for making the devices 104 is transferred to the intermediate circuit tier 112, for example to the metal interconnection tiers 118 which are covered with a dielectric layer comprising, for example, oxide. An oxide layer may cover one of the faces of the transferred layer of material so that oxide-oxide bonding may be implemented to secure the layer of material to the intermediate circuit tier 112. As for making the intermediate circuit tier 112, this transferred layer of material may correspond to a substrate which is then thinned after being secured to the intermediate circuit tier 112, or this transferred layer of material may correspond to a layer which is already thinned and which is transferred to the intermediate circuit tier 112 using a temporary substrate secured to this thinned layer and used for handling it. In this case, the temporary substrate is removed after the thinned layer has been secured to the intermediate circuit tier 112.

The devices 104 and any possible microelectronic components associated with the devices 104 (corresponding to the analogue circuit 105 shown in FIG. 6) are then made. As for making the digital components in the intermediate circuit tier 112, these steps are implemented at temperatures compatible with the presence of the components in the lower 106 and intermediate 112 circuit tiers, for example of less than about 400° C. The electrical interconnection tier(s) 120 are then made, and then interconnections are subsequently made through the upper layer 102 to ensure the electrical connections coupled to the semiconductor devices 104.

Making the upper layer 102 and the devices 104 corresponds to the technique implemented in 3D sequential technology. FIG. 6 schematically shows the sensor 100 obtained according to this second exemplary embodiment.

According to a third exemplary embodiment, the devices 104 are made in the upper layer 102 in a frontside illumination configuration, but implementing 3D parallel technology. For this, the devices 104 as well as any possible microelectronic components associated with these devices 104 are firstly made in a semiconductor substrate. As previously, the steps implemented correspond in particular to steps of lithography, etching, doping, etc. One or more electrical interconnection tiers 120 are then made on the photodetectors 104 but not covering at least part of the photosensitive areas of the photodetectors 104. The assembly is then transferred and secured to the intermediate circuit tier 112 such that the electrical interconnection tier(s) 120 are disposed at the front face of the circuit 100. The electrical connections between this tier or these tiers 120 and the components forming the analogue part of the circuit 100 and located in the lower circuit tier 106 are obtained by making TSV-type interconnections through the upper circuit tier 102. FIG. 7 schematically shows the sensor 100 obtained according to this third exemplary embodiment.

Implementation details of the 3D sequential technology described in document [4] by P. Batude et al, "3D Sequential Integration: Application-driven technological achievements and guidelines", 2017 ISSS International Electron Devices Meeting, San Francisco, USA, Dec. 2-6, 2017, may apply for making digital components in the intermediate layer 112 and possibly the semiconductor devices in the upper layer 102.

Alternatively to the exemplary embodiments previously described in connection with FIGS. 5-7 in which the devices 104 correspond to semiconductor photodetectors, the devices 104 may correspond to photodetectors made in an organic or colloidal photosensitive layer. FIG. 8 shows such an exemplary embodiment of a BSI sensor in which a matrix of photodetectors 104 is made in a photosensitive layer 101. A transparent electrode 107 common to all photodetectors 104 is formed on the photosensitive layer 101. An electrically conductive layer 103 is disposed between the photosensitive layer 101 and the intermediate circuit tier 112. This layer 103 is formed of several distinct portions each forming a second electrode of one of the photodetectors 104.

FIG. 9 shows another exemplary embodiment of an FSI sensor in which the matrix of photodetectors 104 is made in the photosensitive layer 101. Here, the common electrode 107 is disposed between the photosensitive layer 101 and the intermediate circuit tier 112, and the electrically conductive layer 103 forming the second electrodes of the photodetectors 104 is disposed at the front face of the circuit 100.

The different possibilities for making the upper circuit tier 102 previously described in connection with FIGS. 5 to 7 may apply for making the upper circuit tier 102 of the sensor 100 of FIGS. 8 and 9.

In the first embodiment described above, components of the conversion circuit 110 are made partly in the lower circuit tier 106 and partly in the intermediate circuit tier 112. Alternatively, it is possible that only part of the analogue components of the conversion circuit 110 are made in the lower circuit tier 106 and the other analogue components and the digital components of the conversion circuit 110 are made in the intermediate circuit tier 112, or that only part of the digital components of the conversion circuit 110 are made in the intermediate circuit tier 112 and the other digital components and the analogue components of the conversion circuit 110 are made in the lower circuit tier 106. In another alternative, it is possible that all components, both analogue and digital, of the conversion circuit 110 are made in the lower circuit tier 106 or in the intermediate circuit tier 112.

Figure 10:
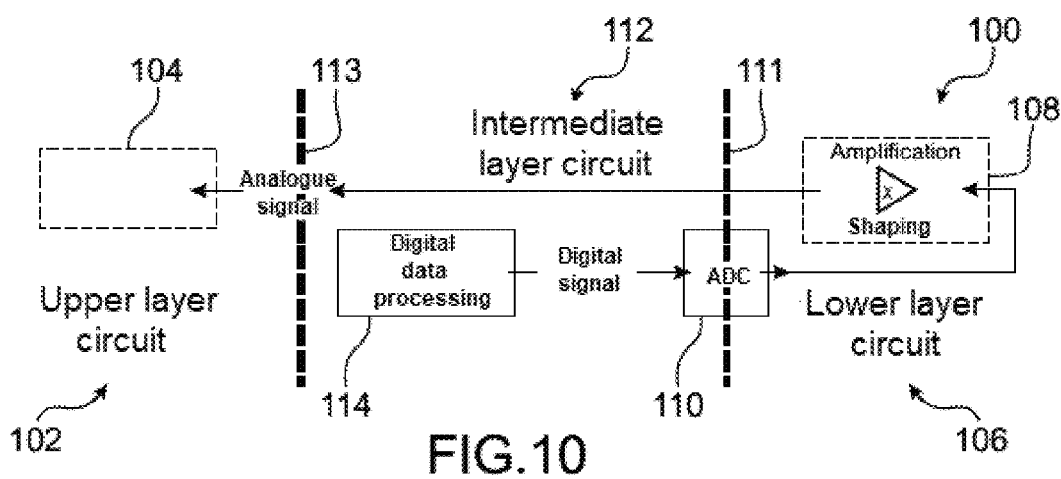
FIG. 10 schematically shows the path of data transmitted in a microelectronic circuit according to a second embodiment.

FIG. 10 schematically shows the path of data in a three-dimensional microelectronic circuit 100 according to a second embodiment. In this second embodiment, the circuit 100 corresponds to a device including a matrix of semiconductor devices 104 of the transmitter-type, for example a display, and the path of data shown in FIG. 10 corresponds to the route travelled by the data to be transmitted by the circuit 100, for example images to be displayed by the circuit 100.

As in the first embodiment, the circuit 100 includes the stack of the three circuit tiers 102, 106 and 112 in which the microelectronic components of the different functions (analogue, digital, transmission) of the circuit 100 are made.

The matrix of devices 104, which includes light-emitting diodes, for example, is made in the upper circuit tier 102.

A digital circuit 114 is made in the intermediate circuit tier 112. In contrast to the first embodiment, in which the digital circuit 114 forms the end of the path of data of the circuit 100, in this second embodiment the digital circuit 114 forms the beginning of the path of data of the circuit 100. In other words, the data to be transmitted or displayed by the circuit 100 are transmitted by this digital circuit 114.

The circuit 100 also includes the conversion circuit 110 which performs, in this second embodiment, a digital-to-analogue conversion of the data transmitted by the digital circuit 114. In the example in FIG. 10, the analogue and digital components of the conversion circuit 110 are distributed in the intermediate 112 and lower 106 circuit tiers. However, the alternatives previously described for the first embodiment which relate to the distribution of these components within the lower circuit tier 106 and/or the intermediate circuit tier 112 also apply to this second embodiment.

The outputs of the conversion circuit 110 are connected to the inputs of the analogue circuit 108, which ensures amplification and shaping of the signals received from the conversion circuit 110.

Finally, the analogue circuit 108 outputs signals to be transmitted to the matrix of semiconductor devices 104 via electrical interconnections passing through the intermediate circuit tier 112.

The different examples related to making the circuit 100 previously described in connection with the first embodiment also apply to this second embodiment, as the devices 104 may be made at the front face or rear face of the upper circuit tier 102.

As in the first embodiment, microelectronic components made in the intermediate circuit tier 112 are used to form a digital control or drive circuit of the circuit 100. In particular, this digital control circuit sends digital control signals to the devices 104, and may also be used for driving the conversion circuit 110. The circuit 100 includes electrical interconnections between the upper circuit tier 102 and the intermediate circuit tier 112, different from those used for transmitting the analogue data transmitted from the analogue circuit 108, used for transmitting these digital control signals. This digital control circuit and the signals sent by this digital control circuit to the other elements of the circuit 100 are not shown in FIG. 10.

According to other embodiments, the circuit 100 may include a matrix of devices 104 including MEMS or NEMS devices or THz antennas. For example, the circuit 100 may correspond to a molecular mass measurement device comprising a matrix of NEMS-type devices 104 ensuring molecular mass measurement (the devices 104 being in this case of the detector type). The matrix of NEMS-type devices 104 is, for example, made using a polysilicon layer in which the NEMS devices are made by etching. In this case, the analogue circuit 108 performs demodulation and amplification of the signals outputted by the matrix of devices 104, and the digital circuit 112 provides processing of the signals outputted by the conversion device 110.

According to other exemplary embodiments, the devices 104 may correspond to uncooled or cooled infrared sensors, or even X-ray sensors.

According to another example, the circuit 100 may include THz antenna-type devices 104, that is capable of transmitting and/or receiving electromagnetic waves in the THz range.

In the previously described embodiments, the stack of circuit tiers includes a single intermediate circuit tier 112 disposed between the lower 106 and upper 102 circuit tiers. Alternatively, it is possible for the circuit 100 to include several distinct intermediate circuit tiers 112, disposed between the lower 106 and upper 102 circuit tiers and including digital circuits such as memory circuits and/or data processing circuits. Each of these intermediate circuit tiers has in this case a thickness of less than about 500 nm so that the microelectronic components made in each of these intermediate circuit tiers are made by implementing a 3D sequential integration. In addition, electrical interconnections electrically coupling inputs and/or outputs of the analogue circuit 108 to inputs and/or outputs of the devices 104 pass through each of the intermediate circuit tiers 112.

For all of the previously described embodiments, the sensor 100 may include other elements made in the circuit tiers 102, 106, 112. For example, when the circuit 100 corresponds to an image sensor and the devices 104 correspond to photodetectors disposed in a matrix, the circuit 100 may include a line decoder coupled to the matrix of photodetectors, and a multiplexer the inputs of which are coupled to the outputs of the conversion circuit 110 and the output of which is coupled to the input of the digital circuit 114.

DOCUMENTS CITED

[1]: T. Takahashi et al, "A 4.1 Mpix 280 fps Stacked CMOS Image Sensor with Array-Parallel ADC Architecture for Region Control", IEEE Symposium on VLSI Circuits (VLSI 2017), Kyoto, Japan, 5-8 Jun. 2017.

[2]: US 2017/0338268 A1.

[3]: L. Millet et al, "A 5500 fps 85 GOPS/W 3D stacked BSI vision chip based on parallel in-focal-plane acquisition and processing", IEEE Symposium on VLSI Circuits, Hawaii, USA, 18-22 Jun. 2018.

[4]: L. Millet et al, "A 5 Million Frames Per Second 3D Stacked Image Sensor With In-Pixel Digital Storage", IEEE ESSCIRC International Conference, Dresden, Germany, 3-6 Sep. 2018.

[5]: T. Haruta et al, "A 1/2.3 inch 20 Mpixel 3-layer stacked CMOS Image Sensor with DRAM", IEEE International Solid-State Circuits Conference (ISSCC 2017), San Francisco, USA, 5-9 Feb. 2017.

[6]: US 2015/0163425 A1

The invention claimed is:

1. A microelectronic circuit comprising:
   a stack of a lower circuit tier, an intermediate circuit tier, and an upper circuit tier, distinct from each other and such that the intermediate circuit tier is disposed between the lower circuit tier and the upper circuit tier;
   a matrix of devices configured to output, or receive as an input, analogue electrical signals, made in the upper circuit tier;
   an analogue circuit made in the lower circuit tier;
   a digital processing circuit made in the intermediate circuit tier;
   an analogue-to-digital circuit or digital-to-analogue conversion circuit formed by microelectronic components made in the lower circuit tier or in the intermediate circuit tier, the analogue-to-digital conversion circuit including inputs electrically coupled to outputs of the analogue circuit and to inputs of the digital processing circuit and the digital-to-analogue conversion circuit including outputs electrically coupled to inputs of the analogue circuit and to outputs of the digital processing circuit; and
   electrical interconnections passing through the intermediate circuit tier and electrically coupling at least one of inputs of the analogue circuit to outputs of the devices and outputs of the analogue circuit to inputs of the devices.

2. The microelectronic circuit according to claim 1, wherein the intermediate circuit tier has a thickness of less than about 500 nm, and the electrical interconnections each have a cross-section with a dimension of less than about 200 nm.

3. The microelectronic circuit according to claim 1, wherein the analogue-to-digital or digital-to-analogue conversion circuit includes analogue microelectronic components made in the lower circuit tier and digital microelectronic components made in the intermediate circuit tier.

4. The microelectronic circuit according to claim 1, wherein:
   the number of electrical interconnections passing through the intermediate circuit tier and electrically coupling the analogue circuit to the devices is at least equal to the number of devices such that each device is directly coupled to one of these electrical interconnections; or
   each of the electrical interconnections is coupled to several devices.

5. The microelectronic circuit according to claim 1, wherein the semiconductor devices include photodetectors.

6. The microelectronic circuit according to claim 5, wherein:
   the upper circuit tier includes two opposite main faces,
   the photodetectors are electrically coupled to at least one interconnection metallisation tier disposed on the side of a first of both main faces of the upper circuit tier and facing the intermediate circuit tier and include photosensitive surfaces disposed on the side of a second of both main faces of the upper circuit tier, or the photodetectors include at least one organic or colloidal photodetection layer and an electrically conductive layer forming electrodes of the photodetectors such that the electrically conductive layer is disposed between the photodetection layer and the intermediate circuit tier.

7. The microelectronic circuit according to claim 5, wherein:
   the upper circuit tier includes two opposite main faces,
   the photodetectors are electrically coupled to at least one interconnection metallisation tier disposed on the side of a first of both main faces of the upper circuit tier and include photosensitive surfaces disposed on the side of the first of both main faces of the upper circuit tier or the photodetectors include at least one organic or colloidal photodetection layer and an electrically conductive layer forming electrodes of the photodetectors such that the organic or colloidal photodetection layer is disposed between the electrically conductive layer and the intermediate circuit tier.

8. The microelectronic circuit according to claim 1, wherein the semiconductor devices include light emitting diodes or MEMS or NEMS devices or THz antennas.

9. The microelectronic circuit according to claim 1, including distinct intermediate circuit tiers disposed between the lower and upper circuit tiers and including digital circuits such as memory circuits or data processing circuits, each intermediate circuit tier having a thickness of less than about 500 nm, and wherein the electrical interconnections electrically coupling the analogue circuit to the devices pass through each of the intermediate circuit tiers.

10. The circuit according to claim 1, wherein the analogue circuit is an amplification circuit or a processing circuit.

11. A method for making a microelectronic circuit, comprising:
    making, in a lower circuit tier including a first substrate, at least one analogue circuit; and then
    making at least one intermediate circuit tier on the lower circuit tier; and then
    making at least one digital processing circuit in the intermediate circuit tier;
    making at least one matrix of devices, configured to output, or receive as an input, analogue electrical signals, in an upper circuit tier, wherein the intermediate circuit tier is disposed between the upper circuit tier and the lower circuit tier;
    making at least one analogue-to-digital circuit or digital-to-analogue conversion circuit formed by microelectronic components made in the lower circuit tier during steps common to making of the analogue circuit or in the intermediate circuit tier during steps common to making of the digital processing circuit, the analogue-to-digital conversion circuit including inputs electrically coupled to outputs of the analogue circuit as well as to inputs of the digital processing circuit and the digital-to-analogue conversion circuit including outputs electrically coupled to inputs of the analogue circuit and to outputs of the digital processing circuit; and
    making electrical interconnections passing through the intermediate circuit tier, electrically coupling at least one of inputs of the analogue circuit to outputs of the devices and outputs of the analogue circuit to inputs of the devices.

12. The method according to claim 11, wherein the digital processing circuit is made in the intermediate circuit tier with a thermal budget of less than about 500° C.

13. The method according to claim 11, wherein making the intermediate circuit tier includes:

bonding a second semiconductor substrate to the lower circuit tier, and then thinning the second semiconductor substrate, or transferring a semiconductor layer to the lower circuit tier implemented using a first temporary substrate to which the semiconductor layer is secured, or depositing the semiconductor layer onto the lower circuit tier.

14. The method according to claim 11, wherein making the upper circuit tier includes:

bonding a third substrate to the intermediate circuit tier, and then thinning the third substrate, or transferring a layer of material, used for making the matrix of devices, to the intermediate circuit tier implemented using a second temporary substrate to which said layer of material is secured, or depositing the layer of material used for making the matrix of devices onto the intermediate circuit tier, or transferring the upper circuit tier to the intermediate circuit tier.

15. The method according to claim 14, wherein the layer of material used for making the matrix of devices corresponds to a semiconductor layer or to an organic or colloidal photodetection material layer.

16. The method according to claim 14, wherein the matrix of devices is made in the upper circuit tier with a thermal budget of less than about 500° C.

* * * * *